United States Patent [19]

Yamamori

[11] Patent Number: 5,675,265
[45] Date of Patent: Oct. 7, 1997

[54] METHOD OF MEASURING DELAY TIME IN SEMICONDUCTOR DEVICE

[75] Inventor: Nobuaki Yamamori, Tokyo, Japan

[73] Assignee: NEC Corporation, Tokyo, Japan

[21] Appl. No.: 781,921

[22] Filed: Dec. 30, 1996

Related U.S. Application Data

[63] Continuation of Ser. No. 309,489, Sep. 22, 1994, abandoned.

[30] Foreign Application Priority Data

Sep. 25, 1993 [JP] Japan .................... 5-261694

[51] Int. Cl.⁶ .................................... G01R 27/28
[52] U.S. Cl. .................. 327/3; 327/2; 327/262; 324/617
[58] Field of Search ................ 327/2, 3, 5, 233, 327/234, 235, 262, 263, 270, 276; 324/617, 621

[56] References Cited

U.S. PATENT DOCUMENTS

| | | | |
|---|---|---|---|
| 4,623,805 | 11/1986 | Flora et al. | 327/269 |
| 4,637,018 | 1/1987 | Flora et al. | 327/273 |
| 4,712,061 | 12/1987 | Lach | 324/83 |
| 4,922,141 | 5/1990 | Lofgren et al. | 327/276 |
| 5,049,766 | 9/1991 | van Driest et al. | 327/269 |
| 5,083,299 | 1/1992 | Schwanke et al. | 324/73.1 |
| 5,188,975 | 2/1993 | Hillis et al. | 327/5 |
| 5,258,660 | 11/1993 | Nelson et al. | 327/261 |
| 5,272,390 | 12/1993 | Watson, Jr. et al. | 327/231 |
| 5,289,403 | 2/1994 | Yetter | 327/141 |
| 5,307,028 | 4/1994 | Chen | 327/3 |
| 5,329,188 | 7/1994 | Sikkink et al. | 327/2 |
| 5,399,984 | 3/1995 | Frank | 327/107 |

FOREIGN PATENT DOCUMENTS 59-126782   6/1984   Japan.

Primary Examiner—Terry Cunningham
Attorney, Agent, or Firm—Whitham, Curtis, Whitham & McGinn

[57] ABSTRACT

A method of measuring a delay time in a semiconductor device which has a particular circuit subject to delay time measurement, a test circuit coupled to an input terminal of the particular circuit for bypassing the particular circuit, and a selector for selectively outputting either an output signal from the particular circuit or an output signal from the test circuit. The method includes the steps of: coupling an input signal generator to the common input terminal and applying a test signal to both the particular circuit and the test circuit, coupling an output signal determination circuit to an output terminal of the selector, detecting a signal on the output terminal of the selector, measuring the respective delay times occurring when the test signal passes through the particular circuit and through the test circuit by the input signal generator and the output signal determination circuit by switching the selector, and obtaining a delay time in the particular circuit by subtracting one of the delay times from the other. The delay time only in the particular circuit can be accurately measured without being influenced by a delay time occurring in the measurement equipment.

7 Claims, 4 Drawing Sheets

METHOD OF MEASURING DELAY TIME IN SEMICONDUCTOR DEVICE

This is a Continuation of application Ser. No. 08/309,489 filed Sep. 22, 1994, now abandoned.

BACKGROUND OF THE INVENTION

(1) Field of the Invention

This invention relates to a semiconductor device, and more particularly to a semiconductor device having a circuit for measuring a delay time of a particular semiconductor circuit formed in the semiconductor device. The invention also relates to a method of measuring a delay time occurring in such semiconductor device.

(2) Description of the Related Art

FIG. 1 shows a conventional timing correction system which has been proposed to correct a phase shift caused by a delay time occurring between input and output terminals of various kinds of circuits formed in a semiconductor device. The timing correction system shown in FIG. 1 includes an input signal generation circuit 1 (hereinafter called a "driver 1") having timing correction arrangements, an output signal determination circuit 2 (hereinafter called a "comparator 2"), and a logic test input/output terminal 6 (hereinafter called a "logic test I/O pin 6") which is provided on a test board 5 and connected to both of the driver 1 and the comparator 2 in parallel through switches 3 and 4, whereby the phase shift (hereinafter called a "skew") is corrected.

More specifically, the driver 1 includes a timing generator 7, a clock distributor 8, a clock selector 9, a signal wave modulator 10, an inter-pins timing adjustment circuit 11, a drive circuit (DR) 12, a skew register 13, and a D/A converter 14. On the other hand, the comparator 2 includes a strobe distributor 15, a strobe selector 16, a comparator 17, a high level comparator (CMP) 18, a low level comparator 19, skew registers 20, D/A converters 21, a high level inter-pins timing adjustment circuit 22, and a low level inter-pins timing adjustment circuit 23.

Timing correction in accordance with this conventional timing correction system will be conducted as follows. First, the logic test I/O pin 6, here a standard I/O pin, on the test board 5 is connected to the respective driver 1 and comparator 2 through switches such as relay means. When correction is made on the driver 1, the standard I/O pin 6 is switched to be connected to the comparator 2 and all of the other I/O pins (not shown) are respectively switched to be connected to the drivers 1. The phase shift of signals appearing on the respective I/O pins connected to the drivers 1 against the standard clock is measured as the delay time. A central processing unit (hereinafter called a "CPU") converts the measured delay time into correction data to be applied to the timing correction arrangements. The correction data is transmitted to the timing correction arrangements so that the necessary skew adjustment is performed. Conversely, when correction is made on the comparator 2, the standard I/O pin is connected to the driver 1 while the other I/O pins are connected to the comparators 2, whereby a skew adjustment may be performed on the comparator 2 in the same way as has been done on the driver 1.

This method was intended to provide a timing consistency between respective inter-terminals, inter-modulations, and inter-clocks of the driver and the comparator. However, since a delay time between the driver and the comparator is not taken into consideration in the conventional system, there is a problem that an accurate test for high speed logic operations cannot be performed.

To solve such a problem, it has been proposed a test device with a standard comparison circuit and standard comparison terminals therefor as disclosed in Japanese Patent Application Kokai Publication No. Sho 61-6836. FIG. 2 shows a schematic block diagram of the device in which a standard comparison circuit 30 and standard comparison terminals 31 are additionally provided. The standard comparison circuit 30 includes comparators 51 and 52, a comparator circuit 53, a strobe distributor 54, and a timing generator 55. An active input signal to be applied to a certain circuit path in a semiconductor device 40 to be tested and an output signal from the semiconductor device 40 are coupled respectively to the standard comparison terminals 31 on a test board 32. A first delay time of the operating circuit path is measured by the standard comparison circuit 30. Then, a second delay time of the circuit path of the semiconductor device 40 is measured by using the logic test I/O pin 6 coupled to the driver 1 and the comparator 2 as shown in FIG. 1, which have timing correction arrangements. The CPU converts the difference between the first delay time and the second delay time into the data suitable for the timing correction arrangements. The converted data is transmitted to the skew registers 13 and 20 and subjected to D/A conversion in the D/A converters 14 and 21. Thus, timing corrections on all the terminals are completed and a timing difference between the driver 1 and the comparator 2 can also be corrected.

The above improved conventional test device, however, has the following deficiencies. First, as far as the delay time occurring between the driver and the semiconductor device and the delay time occurring among circuits in the semiconductor device are concerned, they can be completely corrected. However, as to the delay time due to signal paths from the output of the semiconductor device to the comparator, since these signal paths are not the same, an error may be introduced between the standard comparison circuit and the comparator so that the accuracy of measurement inevitably deteriorates. Second, since this kind of timing correction is performed on a particular signal wave, an error may be introduced in signals which have never been subjected to such timing correction. Third, since the measurement accuracy of the driver or the comparator changes with time, the accuracy will be degraded as time goes by even if the timing remains accurate just immediately after the correction is performed.

SUMMARY OF THE INVENTION

It is, therefore, an object of the present invention to provide a semiconductor device wherein the accuracy of measurement may be improved by reducing the influence of a delay time occurring at the side of the measurement equipment.

It is another object of the present invention to provide a method which is capable of accurately measuring a delay time of a semiconductor device wherein an influence of a delay time occurring at the side of the measurement equipment may be eliminated.

According to the present invention, in a semiconductor device having a particular circuit subject to a delay time measurement, there are provided a test circuit coupled to an input terminal of the particular circuit, for bypassing the particular circuit, and a selector for selectively outputting either one of a signal on an output terminal of the particular circuit and a signal on an output terminal of the test circuit.

Further, according to a method of the present invention, the method of measuring a delay time of a semiconductor device having the above mentioned particular circuit which is subject to a delay time measurement, a test circuit, and a selector comprises the steps of coupling a driver to an input terminal which is commonly connected to both the particular circuit and the test circuit so that a certain signal is inputted to both the particular circuit and the test circuit through the common input terminal, coupling a comparator to an output terminal of the selector so that a signal on the output terminal of the selector is detected, measuring delay times occurring in the particular circuit and the test circuit by the driver and the comparator by switching the selector, and obtaining a delay time occurring in the particular circuit by subtracting one of the delay times from the other.

A control terminal for switching connections is provided in the selector. The control terminal is connected to a part of terminals of the semiconductor device. The selector is switched in accordance with an external control signal applied through the part of the terminals, whereby delay times occurring when a certain signal passes through the particular circuit or the test circuit may be measured respectively.

The delay time occurring when a signal passes through the particular circuit to be tested may be defined as a first delay time, while the delay time occurring when the signal passes through the test circuit may be defined as a second delay time. By subtracting one, between the first and second delay times, from the other, the delay time occurring between the driver and the semiconductor device and the delay time occurring between the semiconductor device and the comparator cancel each other so that the delay time occurring only in the particular circuit to be tested or the test circuit may be measured. If the delay time in the test circuit is made as short as possible in comparison with the delay time in the particular circuit, it is possible to measure a substantially exact value of the delay time occurring in the particular circuit to be tested.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention will be described with reference to the accompanying drawings.

Figure 3:
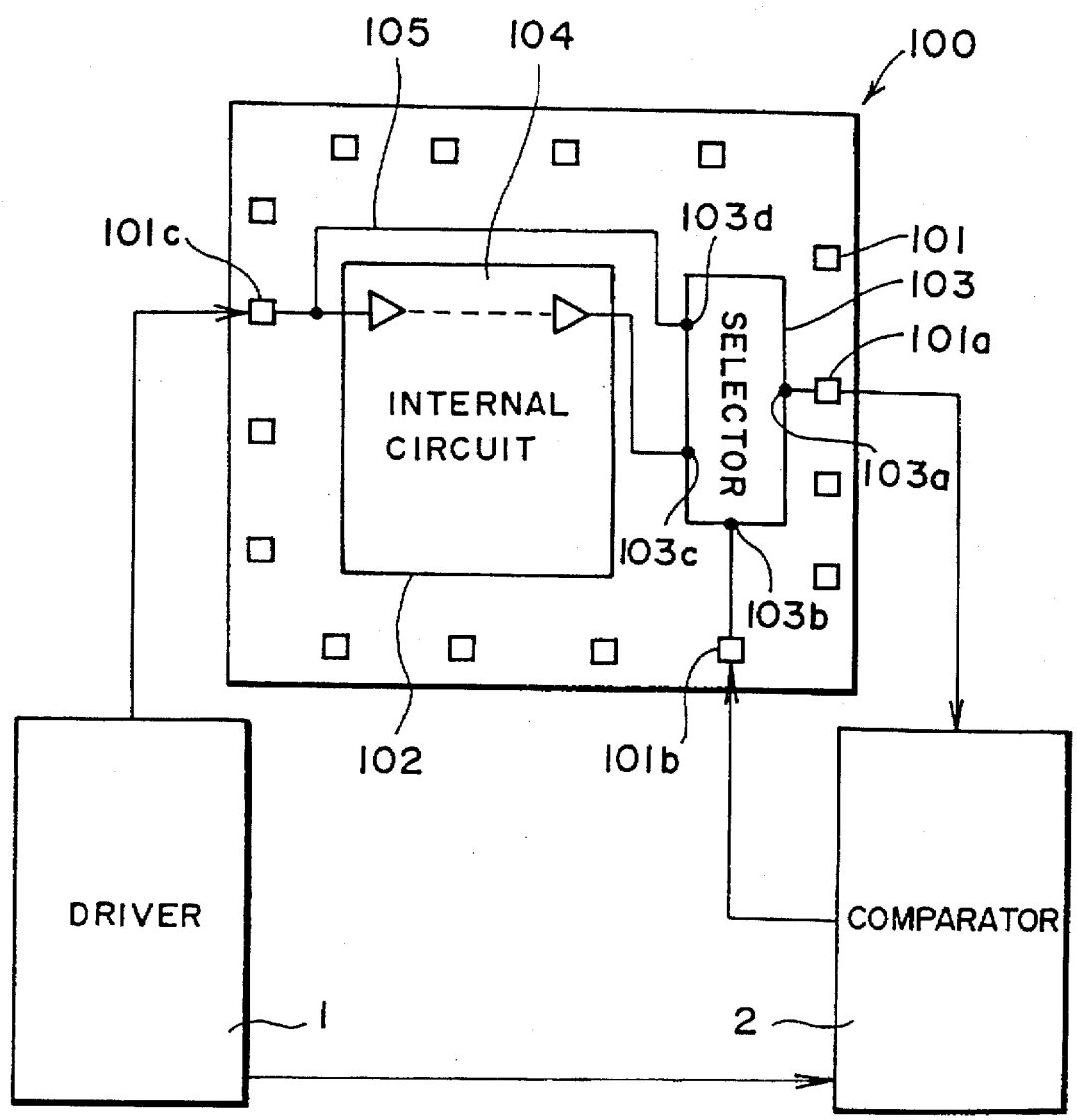
FIG. 3 is a block diagram showing a system of a first embodiment of the present invention.

FIG. 3 is a block diagram showing an embodiment of the present invention. A plurality of input and output pads 101 are arranged in the periphery of a semiconductor device 100 and an internal circuit 102 is arranged in the center thereof. Input and output terminals of the internal circuit 102 are connected or coupled to the input and output pads 101, respectively. In addition to the internal circuit 102, a selector 103 is provided to selectively output as an output signal one of a plurality of input signals inputted thereto. The output signal is selected in accordance with a selection control signal which is externally applied. In this embodiment, the selector 103 has two input terminals 103c and 103d, and one output terminal 103a. The output terminal 103a of the selector 103 is connected to an output pad 101a. The external selection control terminal 103b of the selector 103 is connected to an input pad 101b. An input terminal of a particular circuit 104 (a path) to be tested formed in the internal circuit 102 is connected to an input pad 101c, and an output terminal thereof is connected to one of the input terminals, that is, the input terminal 103c of the selector 103. Also, a test circuit 105 (a path) for bypassing the particular circuit 104 to be tested is provided and connected between the input pad 101c and the other input terminal, that is, the input terminal 103d of the selector 103.

In the semiconductor device described above, when the delay time occurring in the particular circuit 104 to be tested is measured, the driver 1 is connected to the input pad 101c so that the generated signal is applied to both the particular circuit 104 to be tested and the test circuit 105 through the common input pad 101c. The comparator 2 is connected to the output pad 101a and, thus, the output signal from the selector 103 is applied to the comparator 2 so that the delay time may be measured. The comparator 2 provides the selector 103 with the selection control signal through the input pad 101b. The selection control signal selects one of the two input signals as an output signal.

Figure 1:
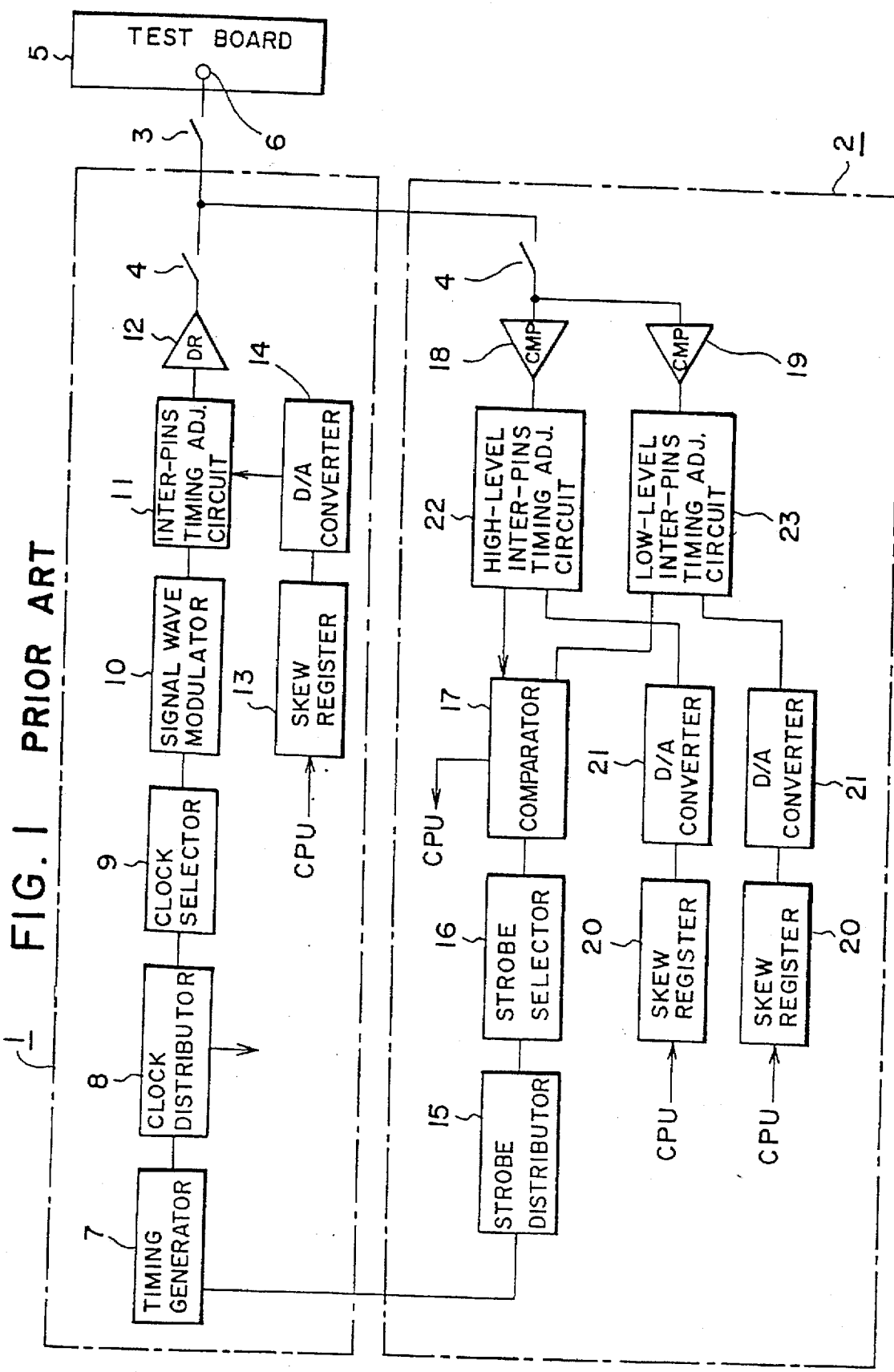
FIG. 1 is a block diagram showing a conventional timing correction system.
Figure 2:
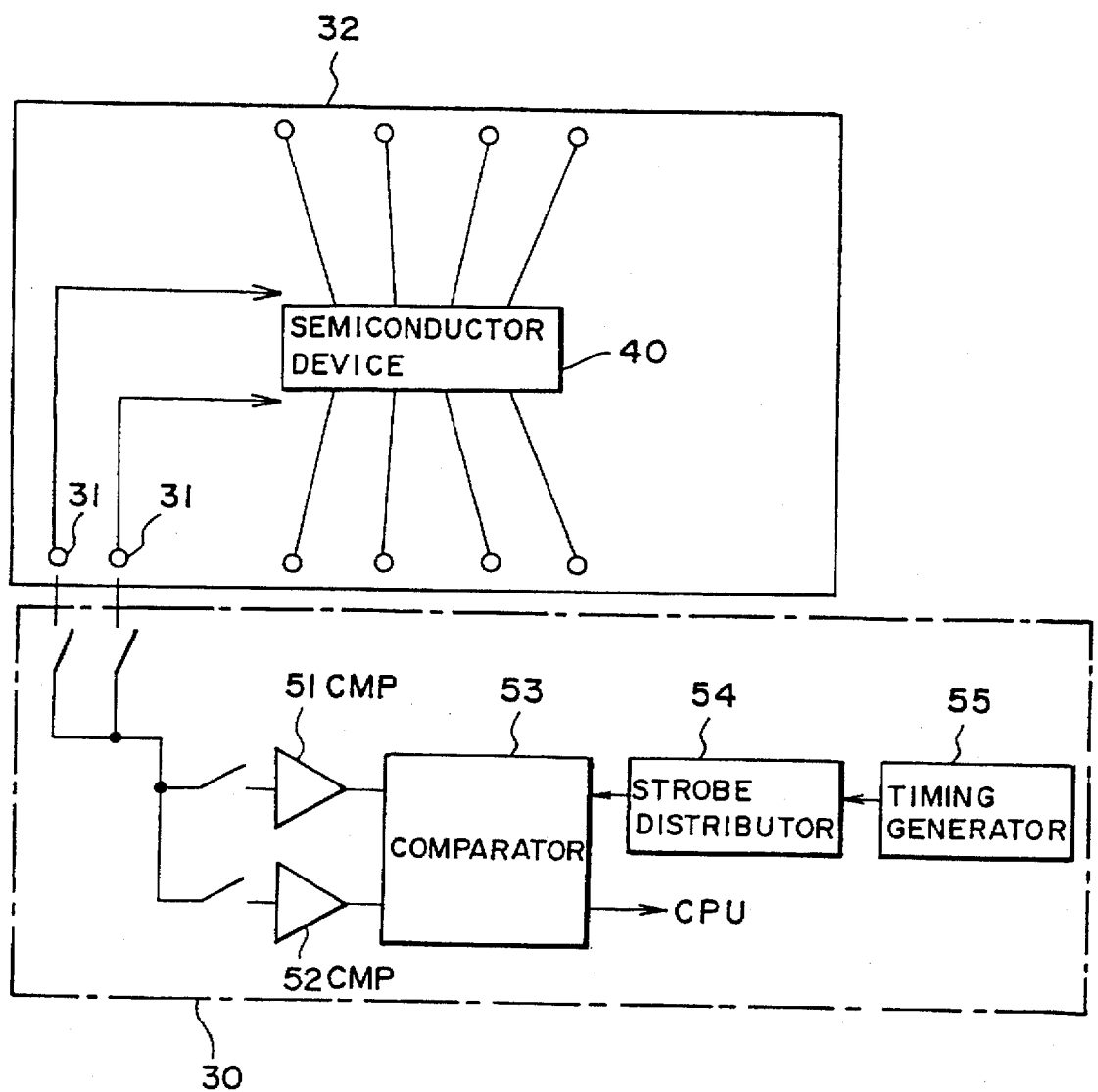
FIG. 2 is a block diagram showing a conventional system for correcting a delay time.

The driver 1 and the comparator 2 shown in FIG. 1 may be used in this embodiment.

After the completion of hard-wiring in the this manner, a certain test signal generated by the driver 1 is applied through the common input pad 101c. In this event, the comparator 2 generates such selection control signal that the output of the particular circuit 104 to be tested is selected as an output of the selector 103. Thus, the signal applied via the input pad 101c passes through the particular circuit 104 to be tested and is selected to be an output by the selector 103. The output of the selector 103 is applied to the comparator 2 through the output pad 101a. The comparator 2 measures the delay time occurring in this event. The delay time measured in this event will be equal to the summation of three delay times, namely, the delay time occurring between the driver 1 and the input of the semiconductor device 100, the delay time occurring in the particular circuit 104 to be tested within the semiconductor device 100, and the delay time occurring between the output of the semiconductor device 100 and the comparator 2.

Next, in accordance with the selection control signal generated by the comparator 2, the selector 103 is switched to select an input signal applied from the test circuit 105 as an output of the selector 103. Similarly as described above, the test signal generated by the driver 1 is applied to the common input pad 101c of the semiconductor device 100. In this case, the test signal passes through test circuit 105 and the selector 103, and is outputted via the output pad 101a to the comparator 2, whereby the delay time occurring when the signal passes through this path, that is, the test circuit 105 is measured. The delay time measured by the comparator 2 in this event will be equal to the summation of the three delay times, namely, the delay time occurring between the driver 1 and the input of the semiconductor device 100, the delay time occurring in the test circuit 105 within the semiconductor device 100, and the delay time occurring between the output of the semiconductor device 100 and the comparator 2.

The summations of the delay times occurring between the driver 1 and the input of the semiconductor device 100 in both of the above mentioned two events should be the same, and the summations of the delay times occurring between the output of semiconductor device 100 and the comparator 2 in both of the above mentioned two events should be the same. Accordingly, if subtraction is made between the delay time measured in the former event and the delay time measured in the latter event, the resultant value should be equal to the difference between the delay time in the particular circuit 104 to be tested and the delay time in the test circuit 105. Thus, the influence of the delay time occurring in the driver 1 and the comparator 2 may be eliminated. This makes it possible to measure the delay time only in the particular circuit accurately without being influenced by the fidelity of these driver and comparator.

Generally, if the test circuit 105 is designed to have a length as short as possible, the above mentioned difference between the two delay times may result in being the same as the delay time in the particular circuit 104 to be tested. This is because the delay time in the test circuit 105 can be made sufficiently short compared with the delay time in the particular circuit 104 to be tested.

Figure 4:
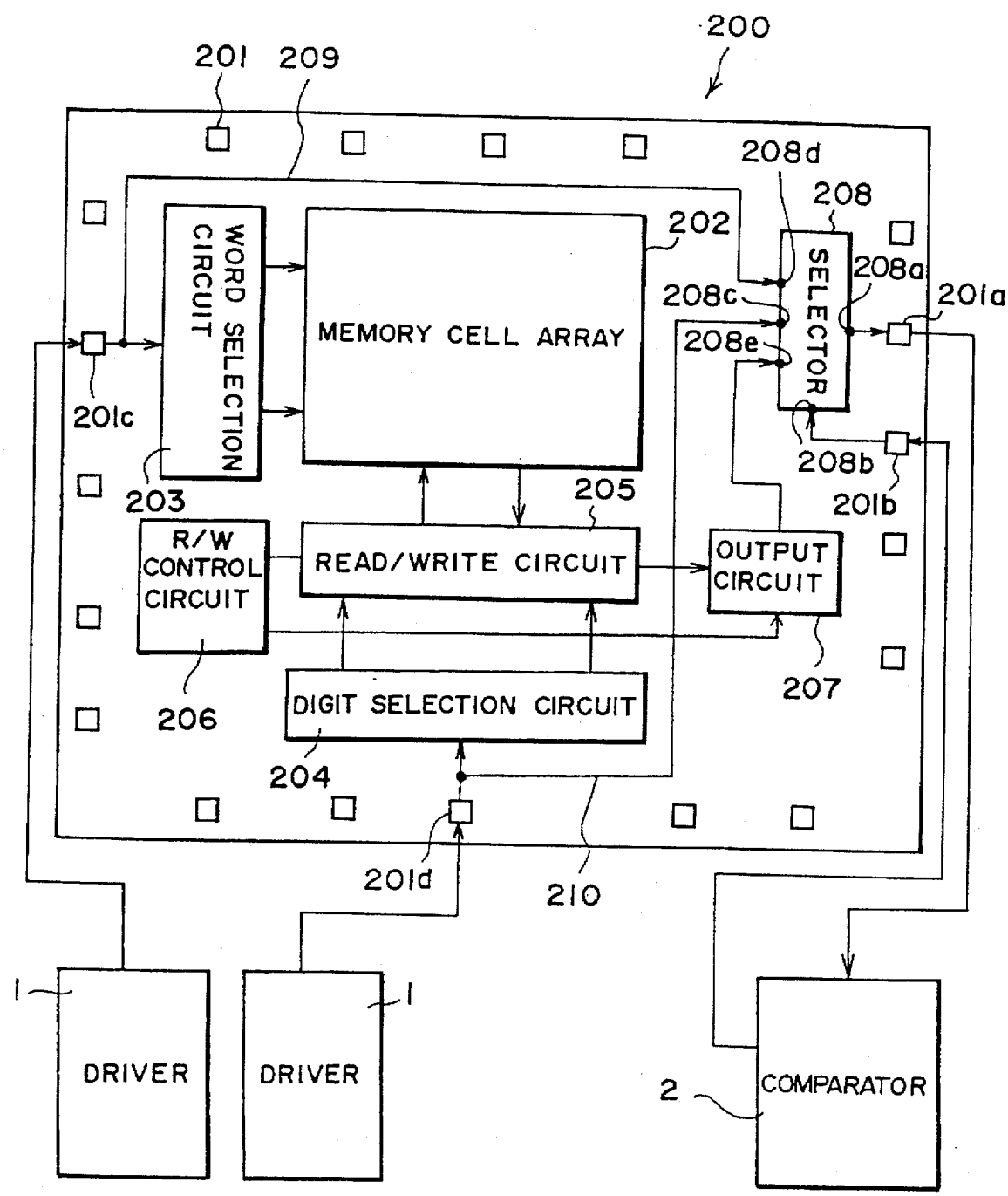
FIG. 4 is a block diagram showing a system of a second embodiment of the present invention.

FIG. 4 is a circuit block diagram showing the second embodiment of the present invention. In this embodiment, the present invention is applied to a semiconductor memory device, whereby the accuracy in measuring the access time is improved. A semiconductor memory 200 includes a plurality of input and output pads 201 arranged in the periphery thereof and a memory cell array 202 capable of storing a certain amount of information. Also, the semiconductor memory 200 includes a word selection circuit 203 for accessing to the memory cell array 202, a digit selection circuit 204, a read/write circuit 205 for writing information into the memory cell array 202 and reading information from the memory cell array 202, a read/write control circuit 206 for controlling the read/write circuit 205, and an output circuit 207 for outputting the read information.

In addition to the above circuit configuration, a selector 208 having three input terminals 208c, 208d and 208e, and one output terminal 208a is provided. The output terminal 208a and a selection control terminal 208b are connected to an output pad 201a and an input pad 201b, respectively. The first input terminal 208e is connected to an output terminal of the output circuit 207. An input pad 201c with which an input terminal of the word selection circuit 203 is connected is connected to a word test circuit 209 for bypassing the word selection circuit 203 and the memory cell array 202. The output of the word test circuit 209 is connected to the second input terminal 208d of the selector 208. Similarly, an input pad 201d, with which an input terminal of the digit selection circuit 204 is connected is connected to a digit test circuit 210 for bypassing the digit selection circuit 204 and the memory cell array 202. The output of the digit test circuit 210 is connected to the third input terminal 208c of the selector 208.

The input pad 201c connected to the word selection circuit 203 and the input pad 201d connected to the digit selection circuit 204 are respectively connected to the drivers 1. The output pad 201a and the input pad 201b with which the selector 208 is connected are connected to the comparator 2.

In accordance with the selection control signal from the comparator 2, the first input 208e of the selector 208 may be selected. Thereafter, certain test signals from the drivers 1 are applied to the input pads 201c and 201d. Then, the word selection circuit 203 and the digit selection circuit 204 are driven and the read/write control circuit 206 is driven by a read/write selection signal generated from a signal source (not shown). This makes it possible to read signals from the memory cell array 202 or write signals into the memory cell array 202. The read signal or written signal passes through the output circuit 207 and the selector 208 and is outputted via the output pad 201a and is applied to the comparator 2. Thus, the delay time occurring when the signal passes through a path from the driver 1 to the comparator 2 through the semiconductor memory device 200 may be measured.

Next, one input out of the second and third inputs 203d and 203c may be selected in accordance with the selection control signal from the comparator 2 and similar measurement of the delay time is performed. By this measurement, the delay time occurring when the signal from the driver 1 passes through the input pad 201c or 201d and the test circuits 209 or 210 and the selector 208 and is outputted via the output pad 201a and is applied to the comparator 2 may be measured. If the latter delay time is subtracted from the former delay time, the delay time occurring from the driver 1 to the semiconductor memory device 200 and the delay time occurring from the semiconductor memory device 200 to the comparator 2 cancel each other in the same way as in the first embodiment. Consequently, the difference between the delay time occurring when the accessing to the memory cell array 202 takes place and the delay time occurring when the signal passes through the test circuit 209 or 210 may be obtained.

If the test circuits 209 and 210 are so designed that the delay times occurring in the test circuits 209 and 210 are made as short as possible compared with the other delay time, the other delay time may be recognized as the delay time in the accessing of the semiconductor memory device 200. Thus, this makes it possible to perform an accurate measurement of the delay time independent of the driver 1 and the comparator 2.

As described above, according to the present invention, there are provided a particular circuit subject to delay time measurement, a test circuit coupled to an input terminal of the particular circuit for bypassing the particular circuit, and a selector for selectively outputting either one of a signal from the particular circuit and a signal from the test circuit. Thus, a delay time occurring in the particular circuit is compared with a delay time occurring in the test circuit and the difference between them is provided so that an accurate measurement of delay time may be performed without suffering from influence of a delay time in the measurement equipment.

Further, according to a method of the present invention, the method includes a step of measuring delay times occurring in the particular circuit to be tested and the test circuit by means of the driver and the comparator with the selector switched and a step of providing the delay time occurring only in the particular circuit on the basis of the difference between the two delay times. By this arrangements, both of the delay time in the particular circuit and the delay time in the test circuit are instantaneously measured so that an accurate delay time only in the particular circuit may be measured by eliminating influence of the delay times occurring in the driver and the comparator.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method of measuring a circuit delay time occurring in a semiconductor device, said method comprising steps of:

coupling an input signal line to an input terminal of a semiconductor device circuit and applying a test signal thereto, said semiconductor device circuit outputting a semiconductor device output signal in response to said input signal;

coupling said input signal to a test circuit bypassing said semiconductor device circuit, said test circuit outputting a test output signal in response to said input signal;

selecting one of said semiconductor device circuit output signal and said test output signal:

measuring a first delay time when said semiconductor device circuit output is selected indicating a time for said test signal to pass through said semiconductor device circuit;

measuring a second delay time when said test output signal is selected indicating a time for said test signal to pass through said test circuit; and obtaining said delay time for said semiconductor device circuit by subtracting said second delay time from said first delay time.

2. The method of measuring a circuit delay time in a semiconductor device according to claim 1 wherein said semiconductor device comprises a plurality of semiconductor device circuits and wherein said step of selecting as said semiconductor device circuit output signal includes selecting from one of said plurality of semiconductor device circuits.

3. The method of measuring a circuit delay time in a semiconductor device according to claim 1, wherein a delay time of said test circuit is designed to be as short as possible.

4. A circuit for measuring a signal delay time through an internal circuit on a semiconductor chip, comprising:

at least one internal circuit on said semiconductor chip having an input terminal and an output terminal;

a test circuit routed around said internal circuit and sharing said input terminal with said internal circuit;

driver means, connected to said input terminal, for passing a test signal through said test circuit and through said internal circuit;

selector means, for receiving an output from said test circuit and from said output terminal of said internal circuit; and comparator means, connected to said selector means and to said driver means, for selecting said output terminal of said internal circuit and measuring a first delay of said test signal from said driver means, through said internal circuit and said selector means, and for selecting said output from said test circuit and measuring a second delay of said test signal from said driver means, through said test circuit and said selector means, and for subtracting said first delay from said second delay to obtain a signal delay time measurement for said internal circuit.

5. A circuit for measuring a signal delay time through an internal circuit as recited in claim 4, wherein said comparator means controls said selector means to alternately select an output from said internal circuit and said test circuit.

6. A circuit for measuring a signal delay time through an internal circuit as recited in claim 4, wherein said internal circuit comprises a memory cell array.

7. A circuit for measuring a signal delay time through an internal circuit as recited in claim 6, wherein said driver means comprises:

a first driver connected to said test circuit and to a word selection circuit of said memory cell array; and a second driver connected to said test circuit and to a digit selection circuit of said memory cell array.

* * * * *